(12) United States Patent
Allott et al.

(10) Patent No.: US 7,522,900 B2
(45) Date of Patent: Apr. 21, 2009

(54) DC OFFSET CORRECTION FOR USE IN A RADIO ARCHITECTURE

(75) Inventors: Stephen Allott, Scotts Valley, CA (US); Louis Pandula, Sunnyvale, CA (US); Edwin X. Li, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 1592 days.

(21) Appl. No.: 09/813,420

(22) Filed: Mar. 20, 2001

(65) Prior Publication Data

US 2002/0160738 A1    Oct. 31, 2002

(51) Int. Cl.
*H04B 1/10* (2006.01)
(52) U.S. Cl. .................. 455/304; 455/296
(58) Field of Classification Search .......... 455/131, 455/232.1, 234.1, 250.1, 245.1, 324, 283, 455/287, 251.1, 304; 375/345, 346
See application file for complete search history.

(56) References Cited

U.S. PATENT DOCUMENTS

| | | | | |
|---|---|---|---|---|
| 3,573,611 | A | * | 4/1971 | Bergemann et al. ......... 324/621 |
| 3,593,150 | A | * | 7/1971 | Michishita et al. .......... 455/261 |
| 4,816,769 | A | * | 3/1989 | Ma et al. .................... 455/337 |
| 4,985,767 | A | * | 1/1991 | Haghiri et al. ......... 375/240.25 |
| 5,241,702 | A | * | 8/1993 | Dent ....................... 455/278.1 |
| 5,325,401 | A | * | 6/1994 | Halik et al. ................. 375/329 |
| 5,631,969 | A | * | 5/1997 | Hanson ..................... 381/107 |
| 5,841,522 | A | * | 11/1998 | Dillon et al. ................. 356/5.1 |
| 6,161,004 | A | * | 12/2000 | Galal et al. ................. 455/302 |
| 6,242,975 | B1 | * | 6/2001 | Eidson et al. ........... 330/124 R |
| 6,321,073 | B1 | * | 11/2001 | Luz et al. ................ 455/239.1 |
| 6,356,736 | B2 | * | 3/2002 | Tomasz et al. ............. 455/3.02 |
| 6,606,483 | B1 | * | 8/2003 | Baker et al. ................. 455/126 |
| 6,985,518 | B2 | * | 1/2006 | Nielsen ..................... 375/152 |
| 2002/0114413 | A1 | * | 8/2002 | Zarubinsky et al. ......... 375/345 |

* cited by examiner

*Primary Examiner*—Sam Bhattacharya

(57) ABSTRACT

A method and apparatus for determining a delay vector from inputs of in-phase and quadrature phase low pass filters to an output of the demodulator of a dual mixer radio receiver and from such delay measurement computing and providing DC offset correction to said receiver.

9 Claims, 4 Drawing Sheets

DC OFFSET CORRECTION FOR USE IN A RADIO ARCHITECTURE

CROSS-REFERENCE TO RELATED APPLICATIONS

This application is related to copending application Ser. No. 09/553,734, filed Apr. 20, 2000, and entitled "RF Receiver with Enhanced IF, Direct Frequency Conversion," which is assigned to the Assignee of the present application.

BACKGROUND OF THE INVENTION

This invention relates in general to the field of radio frequency (RF) receivers and more particularly to direct conversion receivers that include direct current (DC) offset correction.

One type of radio receiver known in the communications arts is the direct-conversion receiver (also referred to as a "homodyne" or "zero-frequency" receiver.) FIG. 1 shows a front-end portion 10 of a typical direct-conversion receiver. An antenna 100 receives an RF signal, which is then typically filtered by a band-pass filter 102 to remove strong out-of-band signals. The filtered signal is then received by a balun 104, which splits the filtered signal and provides impedance matching between filter 102 and a low-noise amplifier (LNA) 106. LNA 106 then amplifies the split signal. A local oscillator 108 provides a reference signal having a frequency that is nominally centered at the channel frequency being received. A quadrature generator 110 operates on the local oscillator signal to generate an in-phase signal and a 90-degree out-of-phase signal. Balanced mixers 112 and 114 receive the in-phase and out-of-phase signals from quadrature generator 110, respectively. Mixers 112 and 114 also receive the amplified signal from LNA 106. Upon receipt of these signals, mixers 112 and 114 generate an in-phase output signal (I-channel) and an out-of-phase (or "quadrature") output signal (Q channel). In effect, mixers 112 and 114 are multiplying devices, which generate both sum frequency components centered around two times the carrier frequency and difference frequency components centered around zero frequency. Low pass filters 116 and 118 operate to filter out the sum frequency components, thereby leaving the downconverted difference frequency components centered around zero frequency in both the I and Q channels.

A problem characteristic of the direct-conversion receiver relates to the downconverted band being centered around zero frequency. Centering of the downconverted band around zero frequency can be problematic, since any extraneous DC offsets may be unwantedly amplified in the I and Q channels. The amplified DC offsets can corrupt the received signal and can even impede reception of the receiver if the DC offsets are amplified to levels that saturate subsequent stages of the receiver. Because of these problems, DC offsets in a direct-conversion should be removed or reduced to acceptable levels.

U.S. Pat. No. 5,241,702 discloses a method of removing DC offsets by digitizing the time derivatives of the received waveform. By using the derivative of the received signal, the DC offsets are removed. Once they are removed, the differentiated signal is amplified and integrated. The integration essentially restores the filtered components to their original values. Using various techniques that exploit predetermined signal patterns or inherent signal properties of the desired signal, the DC offset estimate is then subtracted out of the restored signal, thereby leaving the amplified, received signal substantially free from distortion. A disadvantage of this method, however, is that removal of distortion in the signal path requires complimentary and equalized filter matching.

Another solution to removing the DC offsets is to provide AC coupling in the signal path. However, this approach is also undesirable for a number of reasons. First, to prevent unrecoverable loss of the signal in narrow-band applications, the cutoff frequency of the coupling must be very small. This requires a very large capacitor, which can lower the response time of the receiver. Moreover, introduction of a large capacitor in a receiver design implemented as a monolithic integrated circuit is unfavorable, since large capacitors consume large areas of the integrated circuit implementation. Yet another reason AC coupling is undesirable is that many applications such as, for example, wireless communications, often use a burst-type protocol where a data pattern may emulate a DC level for an extended period of time. AC coupling, in such circumstances, would operate to remove the data pattern, thereby resulting in an unwanted corruption of the data.

SUMMARY OF THE INVENTION

The present invention relates to a direct-conversion type receiver capable of removing DC offsets.

According to a first aspect of the invention, a radio receiver comprises an amplifier configured to receive and amplify an intermediate frequency modulated signal having in-phase and quadrature phase DC components; an analog-to-digital converter configured to receive the amplified intermediate frequency modulated signal and convert it to a digital signal; a demodulator operable to demodulate the digital signal; and DC offset calibration means coupled to the demodulator operable to provide in-phase and quadrature phase DC offset correction signals to compensate for the in-phase and quadrature phase DC components at the input of the amplifier.

A delay measurement means may be coupled to the demodulator in the embodiment described above so that it can determine a delay vector characterizing the in-phase and quadrature phase DC components. This delay vector can be used by the DC offset calibration means to provide a digital representation of the in-phase and quadrature phase DC offset correction signals.

According to another aspect of the present invention a radio receiver comprises a receiving stage configured to receive a radio signal; a first mixer stage operable to downconvert the radio frequency signal to a first intermediate frequency in-phase signal and a first intermediate quadrature phase signal; first and second low pass filters configured to receive and low pass filter the first intermediate frequency in-phase and quadrature phase signals; a second mixer stage operable to upconvert the filtered first intermediate frequency in-phase and quadrature phase signals and provide a second intermediate frequency in-phase signal and a second intermediate frequency quadrature phase signal; a summer operable to subtract the second intermediate frequency quadrature phase signal from the second intermediate frequency in-phase signal to provide an integrated signal; an automatic gain control stage coupled to the summer and operable to amplify the integrated signal; an analog-to-digital converter operable to convert the amplified integrated signal to a digital signal; a demodulator operable to demodulate the digital signal; and delay measurement means for determining a delay vector from inputs of low pass filters to an output of the demodulator.

The radio receiver embodiment summarized in the previous paragraph may also include a DC offset calibrator coupled to the delay measurement means; an in-phase digital-to-analog converter coupled between the DC offset calibrator and the second mixer stage; and a quadrature phase digital-to-analog converter coupled between the DC offset calibrator and the second mixer stage. According to this aspect of the invention, the in-phase digital-to-analog converter is operable to provide an in-phase DC offset compensation signal for the automatic gain control stage and the quadrature phase digital-to-analog converter is operable to provide a quadrature phase DC offset compensation signal for the automatic gain control stage.

According to another embodiment of the present invention, a method of determining a signal delay between inputs of first and second low pass filters of a dual mixer stage radio receiver and an output of the receiver's demodulator comprises the steps of applying a first known voltage to an input of an in-phase mixer of the second mixer stage; applying a second known voltage to an input of a quadrature phase mixer of the second mixer stage; setting the gain of an automatic gain control stage, coupled to the second mixer stage, to a full gain; measuring first in-phase and first quadrature phase components at the output of the demodulator; decreasing the gain of the automatic gain control stage by a predetermined amount if the value of each first component is greater than a predetermined maximum threshold value; storing the first in-phase and quadrature phase components if the value of each component is less than the predetermined maximum threshold value; applying the negative of the first known voltage to the input of the in-phase mixer; applying the value of the second known voltage to the input of the quadrature phase mixer; measuring second in-phase and second quadrature phase components at the output of the demodulator; decreasing the gain of the automatic gain control stage by a predetermined amount if the value of each second component is greater than the predetermined maximum threshold value; storing the second in-phase and quadrature phase components if the value of each second component is less than the predetermined maximum threshold value; and using the first and second quadrature phase components to compute the signal delay.

According to another embodiment of the present invention, a method of setting signal levels of in-phase and quadrature phase components of a radio receiver between a minimum threshold voltage and a maximum threshold voltage, the method comprising the steps of: (a) setting the gain of an automatic gain control to a gain value at which the signal levels of the in-phase and quadrature phase components are less than or equal to the maximum threshold voltage; (b) comparing the signal levels of the in-phase and quadrature phase components to a predetermined minimum threshold value; (c) increasing the gain of the automatic gain control stage by a predetermined amount; and (d) repeating steps (b) and (c) until the signal levels of the in-phase and quadrature phase components are greater than or equal to the predetermined minimum threshold value.

According to yet another embodiment of the present invention, a method of compensating for DC offset voltages present at an input of an automatic gain control of a dual mixer stage radio receiver comprises the steps of determining a signal delay between inputs of in-phase and quadrature phase low pass filters preceding a second mixer stage of the dual mixer stage radio receiver, said signal delay characterizing in-phase and quadrature phase components of the DC offset voltage present at the input of the automatic gain control; using the determined signal delay to separate and define digital representations of the in-phase DC offset voltage component and the quadrature phase DC offset voltage component; making the digital representation of each of the in-phase and quadrature phase components more positive or more negative if it is more negative or more positive than in-phase and quadrature phase DC offset correction words, respectively; and performing the above sequence of steps a predetermined number of times to reduce the DC offset voltage at the input of the automatic gain control.

A further understanding of the nature and advantages of the inventions herein may be realized by reference to the remaining portions of the specification and the attached drawings.

DESCRIPTION OF THE SPECIFIC EMBODIMENTS

Figure 1:
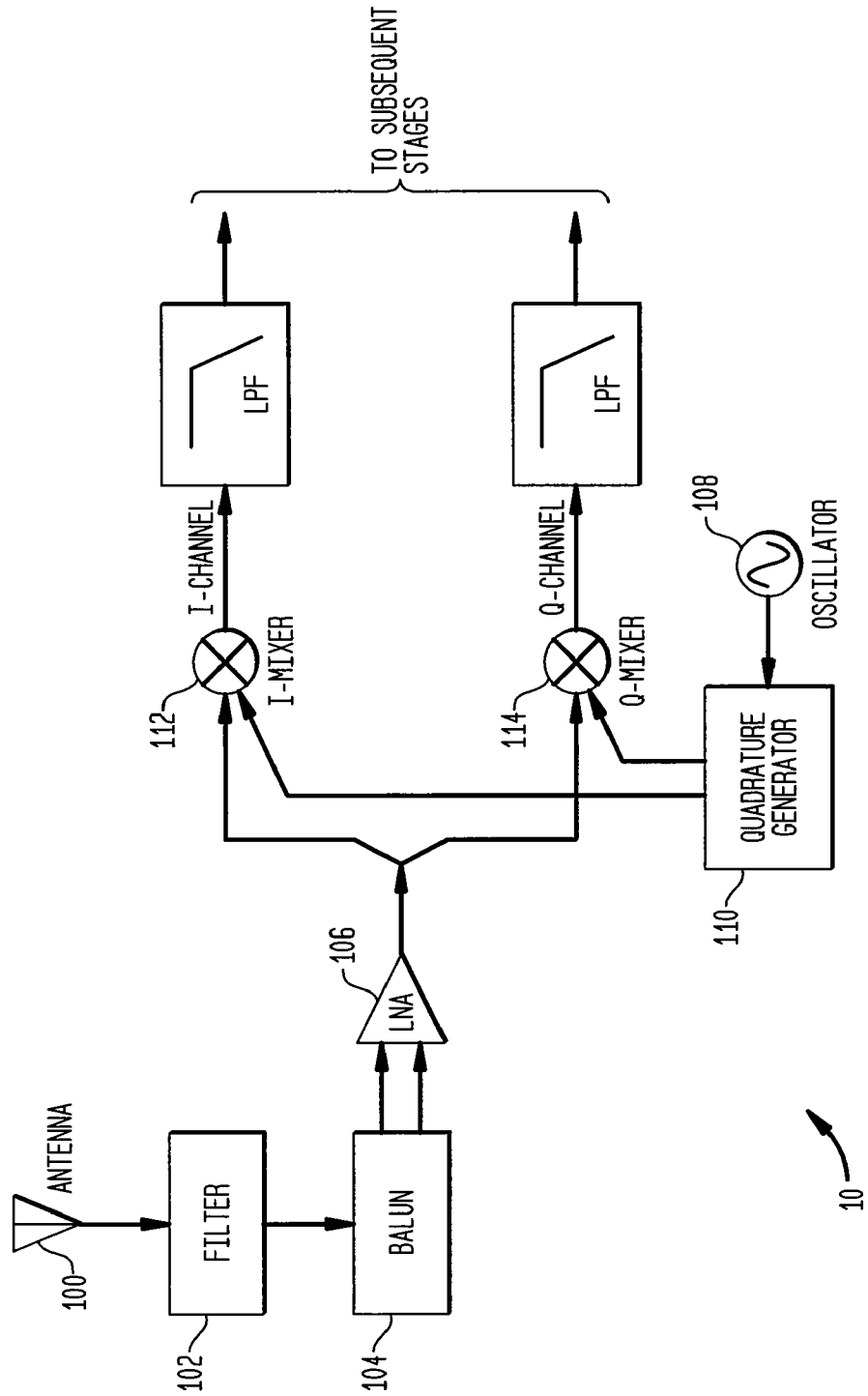
FIG. 1 shows a schematic illustration of a front-end portion of a typical direct-conversion receiver.
Figure 2:
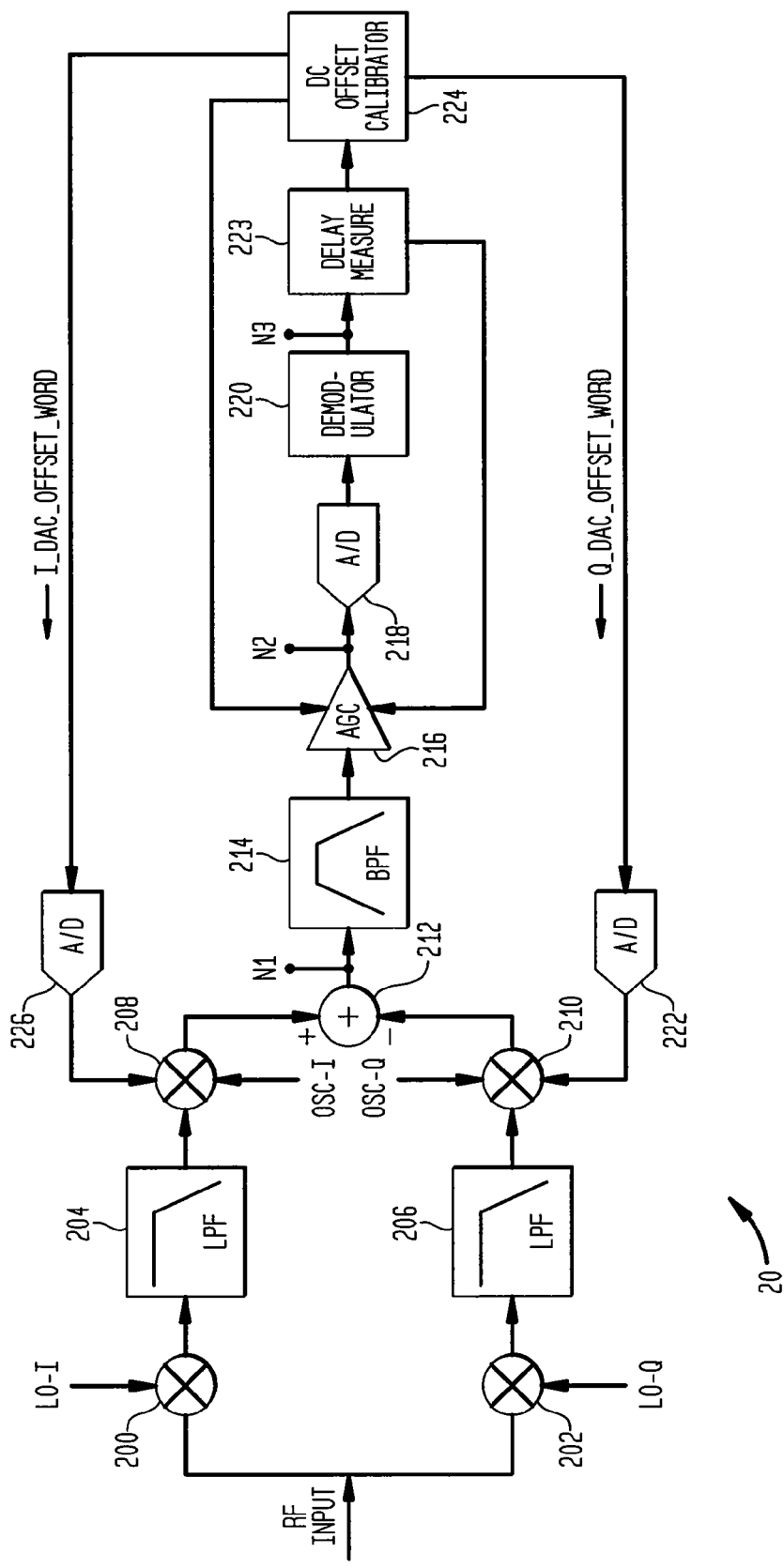
FIG. 2 shows an exemplary schematic diagram of a direct conversion receiver having DC offset correction, according to an embodiment of the present invention.

Referring to FIG. 2, there is shown an exemplary schematic diagram 20 of a direct conversion receiver with DC offset correction, according to an embodiment of the present invention. An RF signal band is received by an antenna (not shown in FIG. 2) and is then downconverted by a first in-phase mixer 200 and a first ninety-degree out-of-phase (i.e. "quadrature" mixer 202 to produce an in-phase channel (i.e. I-channel) and a quadrature phase channel (i.e. Q-channel), respectively. The downconversion results in the signal band being centered around a first intermediate frequency, $\omega_1$.

Following downconversion, the signal bands on the I and Q channels are filtered by low-pass filters 204 and 206, to remove extraneous out-of-band high frequency signals, and are then input into a second in-phase mixer 208 and a second quadrature phase mixer 210. Second in-phase and second out-of-phase mixers 208 and 210 operate to upconvert the downconverted signal band to a band centered around a second intermediate frequency, $\omega_2$.

Following upconversion of the signal band to the second intermediate frequency, $\omega_2$, the signal band on the Q channel is subtracted from the signal band on the I channel, by summer 212, to provide a single, integrated signal at node N1. The signal at N1 is then input into a band-pass filter 214, which operates to select the signal band and reject out-of-band signals and interferers. The filtered signal band is amplified by an amplifier, i.e., automatic gain control (AGC) 216, converted to a digital signal by analog-to-digital (i.e. A/D) converter 218 and, finally, demodulated by demodulator 220. Further details of the structure and operation of the receiver described above are included in copending U.S. patent application Ser. No. 09/553,734, which is hereby incorporated into this application by reference.

The signal at node N1 in FIG. 2 can be written as $$VN1 = (K_1 V_{I,dc} + K_2 V_{I,corr}) \cos \omega t - (K_1 V_{Q,dc} + K_2 V_{Q,corr}) \sin \omega t \quad (1)$$

where $V_{I,dc}$ and $V_{Q,dc}$ are the DC offset voltages attributable to the I and Q channels, $V_{I,corr}$ and $V_{Q,corr}$ are correction voltages and $K_1$ and $K_2$ are gain factors associated with previous stages of the receiver. Correction voltages $V_{I,corr}$ and $V_{Q,corr}$ are voltages, which can be applied to correct against DC offset voltages in the I and Q channels, respectively. This aspect of the invention will be described in more detail below.

By defining $A=(K_1V_{I,dc}+K_2V_{I,corr})$ and $B=(K_1V_{Q,dc}+K_2V_{Q,corr})$, Equation (1) can be written as $$VN1=(A\cos\omega t - B\sin\omega t) \quad (2)$$

After passing through band-pass filter 214 and amplifier 216, the signal at node N2 in FIG. 2 can be written as $$VN2=G_{AGC}[A\cos(\omega t+\theta)-B\sin(\omega t+\theta)] \quad (3)$$

where $G_{AGC}$ is the gain of AGC 216 and $\theta$ characterizes a signal delay in the receiver signal path.

The DC offset that is present in the signal path can be measured at the output of demodulator 220 (i.e. at node N3). However, because the DC offset at node N3 has been delayed through previous stages in the integrated signal path (i.e the path from the second in-phase and quadrature phase mixers 208 and 210), the true DC offsets contributed by each of the I and Q components are intermingled.

To address this problem, an embodiment of the present invention comprises a delay measurement procedure, which separates the true I and Q components of the DC offset and determines the delay vector angle, $\theta$, of the integrated signal path. The measured delay vector angle, $\theta$, is then used to determine DC offset correction values to compensate for the I and Q components of the DC offset.

Figure 3:
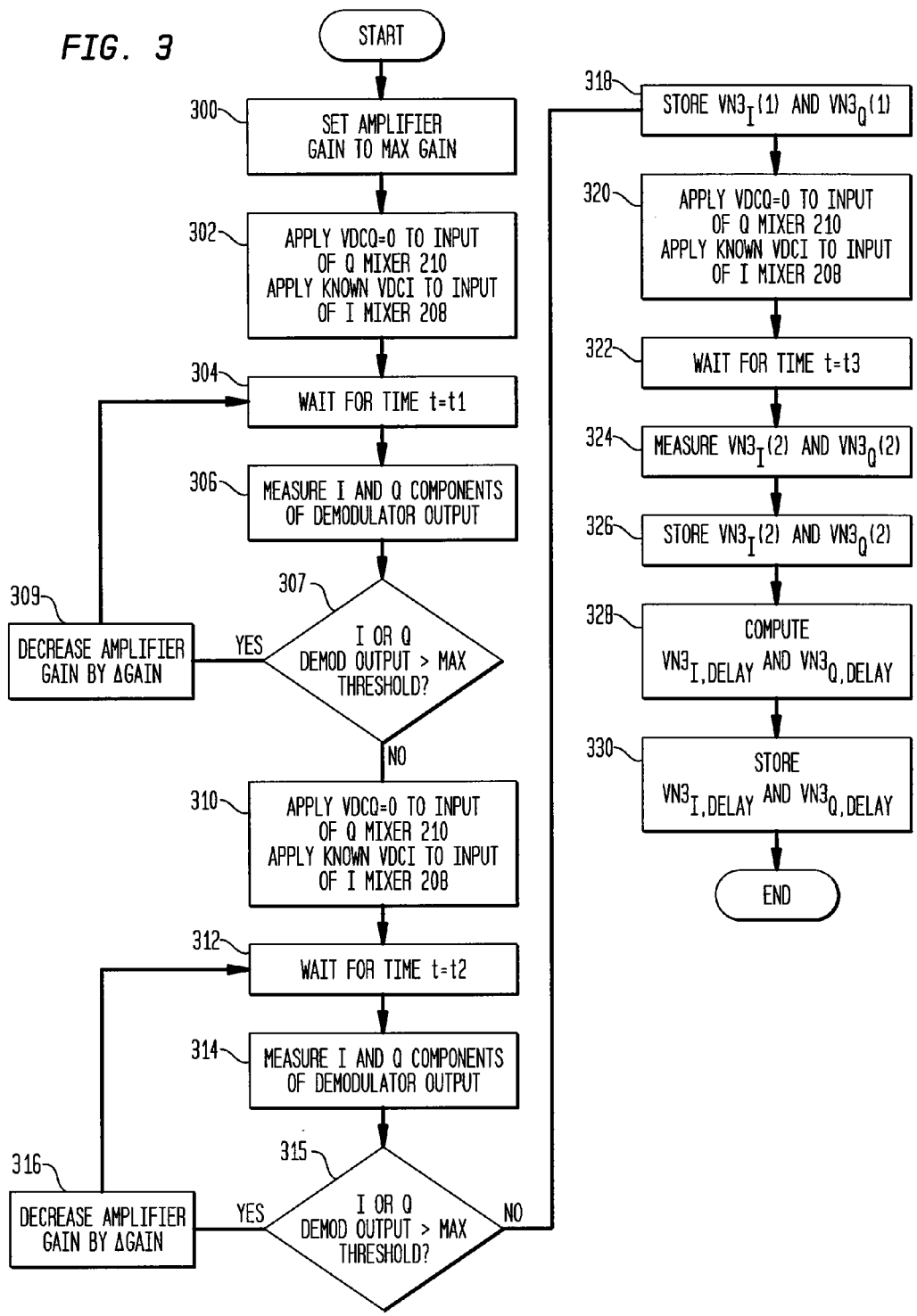
FIG. 3 shows an exemplary flow diagram of a delay measurement procedure, according to an embodiment of the present invention.

Referring now to FIG. 3, there is shown a flow diagram illustrating the delay measurement procedure, according to an embodiment of the present invention, for the exemplary receiver 20 in FIG. 2. The following steps of the delay measurement procedure are performed by a state machine contained within, for example, delay measurement block 223 in FIG. 2. At step 300, the gain of amplifier 216 is set to its maximum value. Then, at step 302 a known DC voltage, VDCI, is applied to an offset input of in-phase mixer 208 and VDCQ=0 is applied to an offset input of quadrature phase mixer 210. The analog values of VDCI and VDCQ are derived from digital-to-analog converters (i.e. DACs) 222 and 226, each of which converts an associated predetermined digital signal, output from demodulator 220, to an analog signal, via a DC Offset Calibrator 224. At step 302, a known DC voltage, VDCI, is applied to an input of in-phase mixer 208. Notice that VDCI, is derived from DAC 226, which converts an associated predetermined digital signal, output from demodulator 220, via a DC Offset Calibrator 224.

Next, at step 304 a time $t=t_1$ (e.g. 10 μs) is allowed to expire to allow the receiver 20 to respond to the applied voltages and settle into a steady state. At step 306, the I and Q components of the demodulator output are measured and compared to a known maximum allowable threshold voltage associated with the demodulator. If either of the measured I or Q components are greater than this threshold voltage, at step 308 the gain of amplifier 216 is decreased by a given amount (e.g. −3 dB) and then steps 304-307 are repeated until both the I and Q components of the demodulator output are both below the threshold.

Next, at step 310—VDCI, is applied to the offset input of in-phase mixer 208 and VDCQ=0 is applied to the offset input of quadrature phase mixer 210. At step 312 a time $t=t_2$ (e.g. $t_1=t_2=10$ μs) is allowed to expire to allow the receiver 20 to respond to the applied voltages and settle into a steady state. At step 314, the I and Q components of the demodulator output are measured and then compared, at step 315, to a known maximum allowable threshold voltage associated with demodulator 220. If either of the measured I or Q components is greater than this threshold voltage, at step 316 the gain of amplifier 216 is decreased by a given amount (e.g. −3 dB) and then steps 312-315 are repeated until both the I and Q components of the demodulator output are both below the maximum threshold. When the latter is reached, at step 318 the I and Q components of the signal at node N3 (i.e. at the demodulator output) are stored in a memory device (not shown in the figures) as $VN3_I(1)$ and $VN3_Q(1)$.

Next, at step 320 VDCI is applied to the offset input of in-phase mixer 208 and VDCQ=0 is applied to the offset input of quadrature phase mixer 210. At step 322 a time $t=t_3$ (e.g. $t_1=t_2=t_3=10$ μs) is allowed to expire to allow the receiver 20 to respond to the applied voltages and settle into a steady state. At step 324, the I and Q components of the signal at the demodulator output are measured and stored, at step 328, in the memory device as $VN3_I(2)$ and $VN3_Q(2)$.

Finally, at steps 328 and 330, delay signals $\overline{VN3_{I,delay}}=[VN3_I(1)-VN3_I(2)]$ and $\overline{VN3_{Q,delay}}=-[VN3_Q(1)-VN3_Q(2)]$ are computed and stored.

From Equations 5a and 5b above, $\overline{VN3_{I,delay}}$ and $\overline{VN3_{Q,delay}}$ can be written as $$\overline{VN3_{I,delay}} = \frac{G_{AGC}}{2}K_2(V^d_{I,corr})\cos\theta \quad (6a)$$

$$\overline{VN3_{Q,delay}} = \frac{G_{AGC}}{2}K_2(V^d_{I,corr})\sin\theta \quad (6b)$$

where $V^d_{I,corr}$ is a predetermined constant set in the receiver design (e.g. 400 mV).

Equations 6a and 6b contain a delay vector angle, $\theta$, which characterizes the mixed I and Q component signal delay from the inputs of low pass filters 204 and 206 to the output of demodulator 220. $\theta$ is used by a state machine in delay measure block 223 to determine the true DC offsets contributed by each of the I and Q channels. More specifically, the state machine determines the following DC offset multiplication factors for both the I and Q channels:

$$M_{I,offset} = \frac{G^2_{AGC}}{2}K_2V^d_{I,corr}(K_1V_{I,dc}+K_2V_{I,corr}) \quad (7a)$$

$$M_{Q,offset} = \frac{G^2_{AGC}}{2}K_2V^d_{I,corr}(K_1V_{Q,dc}+K_2V_{Q,corr}) \quad (7b)$$

The DC offset multiplication factors in Equations 7a and 7b are used by a DC offset calibrator 224 to provide digital correction signals that compensate for I and Q DC offset components.

To provide for a full range of DC offset compensation, it is preferred that a digital coding scheme, which allows both positive and negative representation of numbers, be employed. One such digital coding scheme that can be used is the 2's complement scheme.

Figure 4:
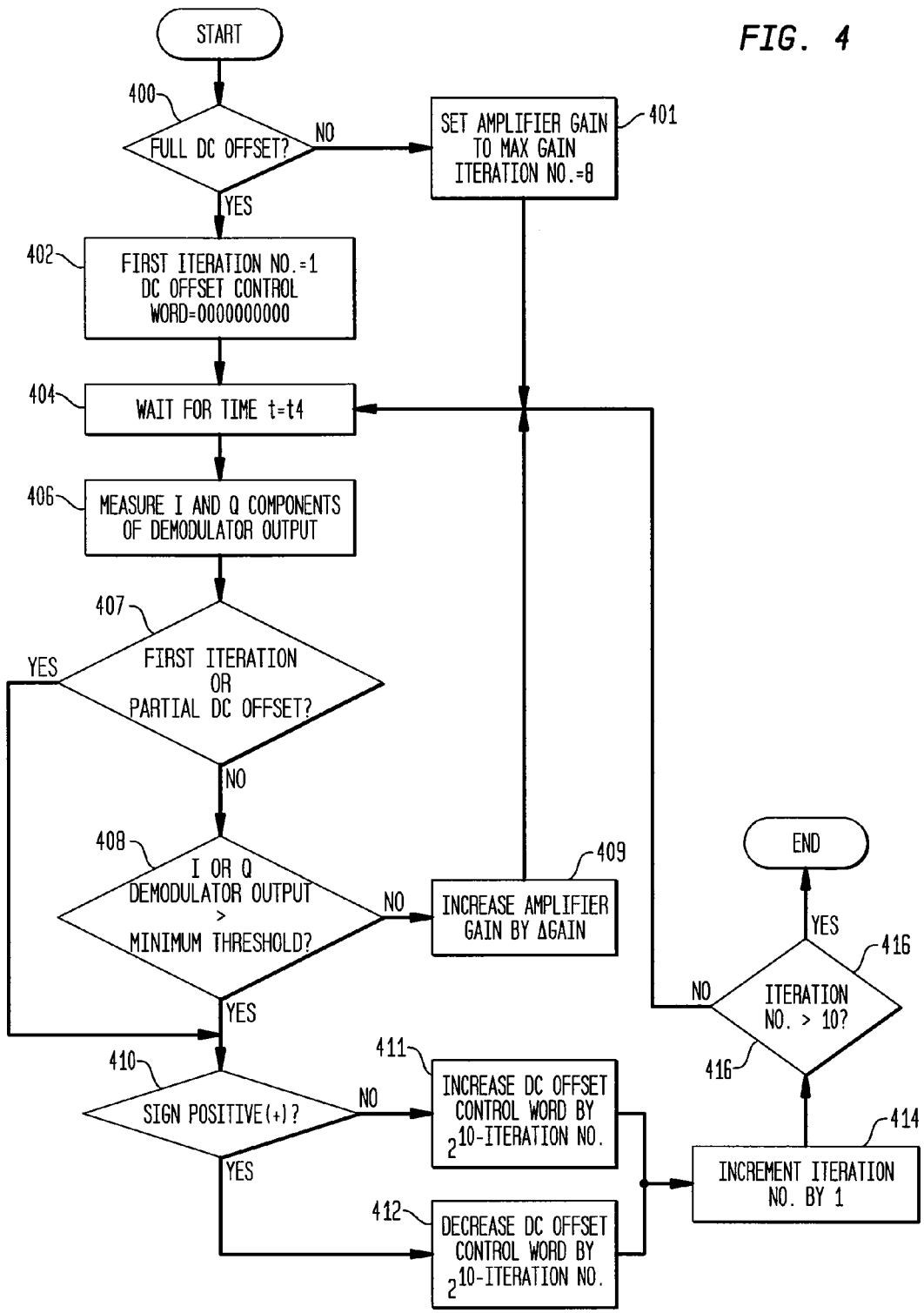
FIG. 4 shows an exemplary flow diagram of DC offset correction procedure, according to an embodiment of the present invention.

FIG. 4 illustrates the DC offset correction scheme in the context of the operation of the direct-conversion receiver topology (e.g. FIG. 2) of the present invention. For illustrative purposes, ten-bit offset correction words, i.e., I_DAC_OFFSET_WORD and Q_DAC_OFFSET_WORD, and corresponding ten-bit DACs 222 and 226 are employed in this exemplary embodiment. However, while ten-bit words are shown, it is understood that other bit-length words can be used, depending on the bit-length of the DACs in the design and the design application at hand.

The first step, step 400, in the DC offset operation in FIG. 4 is to determine whether a full DC offset operation needs to be performed (e.g. as may be the case following a power up condition of receiver 20) or if only a partial DC offset operation need be performed (e.g. as may be the case if it is known that the DC offset value is within the voltage range limits of DACs 222 and 226). If only a partial DC offset operation is necessary then, at step 401 a first iteration number is set to a number greater than one (e.g. iteration no.=8) and then step 404 is performed, as explained in detail below.

On the other hand, if a full DC offset or an iteration other than a first iteration for a partial DC offset operation is required, then at step 402 a first iteration number is set to one and both I_DAC_OFFSET_WORD and Q_DAC_OFFSET_WORD are set to 0000000000. Following step 402, a time $t=t_4$ (e.g. 6 μs) is allowed to expire to allow the receiver 20 to settle into a steady state. Then, at step 406 the I and Q components of the demodulator output (i.e. at node N3) are measured. At step 407, if either a first iteration or partial DC offset operation is being performed, the next step, i.e. step 410, checks to see if the DC offset multiplication factors, as measured by Equations 7a and 7b are positive. If either or both of the I channel and/or Q channel DC offset multiplication factors are determined to be positive then, at step 412 the corresponding I_DAC_OFFSET_WORD and/or Q_DAC_OFFSET_WORD control words are decreased by $2^{(10-iteration\ no.)}$. Alternatively, if either or both of the I channel and/or Q channel DC offset multiplication factors are determined to be negative then, at step 411 the corresponding I_DAC_OFFSET and/or Q_DAC_OFFSET control words are increased by $2^{(10-iteration\ no.)}$.

If neither a first iteration nor a partial DC offset operation is being performed, at step 408 the I and Q components of the demodulator output are measured. So long as both are above a minimum threshold voltage set by the demodulator, the process continues to step 410 as explained above. Otherwise the gain of amplifier 216 is increased (by, for example, 3 dB) and step 404 is repeated.

Following either step 411 or 412, depending on whether the DC offset multiplication factors are positive or negative, the iteration number is incremented by one at step 414. Then, at step 416 the iteration number is compared to the number ten. If the iteration number is greater than ten, step 404 is repeated and the process continues until ten iterations have been completed.

The preceding has been a description of the preferred embodiments of the invention. It will be appreciated that deviations and modifications can be made without departing from the scope of the invention, which is defined by the appended claims.

What is claimed is:

1. A radio receiver, comprising:
an amplifier configured to receive and amplify an intermediate frequency modulated signal having in-phase and quadrature phase DC components;
an analog-to-digital converter configured to receive the amplified intermediate frequency modulated signal and convert it to a digital signal;
a demodulator operable to demodulate the digital signal;
DC offset calibration means coupled to the demodulator operable to provide in-phase and quadrature phase DC offset correction signals to compensate for the in-phase and quadrature phase DC components at the input of the amplifier; and
delay measurement means coupled to the demodulator operable to determine a delay vector characterizing the in-phase and quadrature phase DC components.

2. The radio receiver of claim 1, wherein the delay vector is used by the DC offset calibration means to provide a digital representation of the in-phase and quadrature phase DC offset correction signals.

3. The radio receiver of claim 2, further comprising:
a first digital-to-analog converter configured to receive a in-phase component of the digital representation of the in-phase DC offset correction signal for mixing with an in-phase signal and an intermediate frequency carrier signal;
a second digital-to-analog converter configured to receive a quadrature phase component of the digital representation of the quadrature phase DC offset correction signal for mixing with a quadrature signal and the intermediate frequency carrier signal; and
a summer operable to subtract the mixed quadrature phase signal and quadrature phase DC offset correction signal component from the mixed in-phase signal and in-phase DC offset correction signal to provide a DC compensated intermediate frequency modulated signal at the input of the low noise amplifier.

4. A radio receiver, comprising:
a receiving stage configured to receive a radio signal;
a first mixer stage operable to downconvert the radio frequency signal to a first intermediate frequency in-phase signal and a first intermediate quadrature phase signal;
first and second low pass filters configured to receive and low pass filter the first intermediate frequency in-phase and quadrature phase signals;
a second mixer stage operable to upconvert the filtered first intermediate frequency in-phase and quadrature phase signals and provide a second intermediate frequency in-phase signal and a second intermediate frequency quadrature phase signal;
a summer operable to subtract the second intermediate frequency quadrature phase signal from the second intermediate frequency in-phase signal to provide an integrated signal;
an automatic gain control stage coupled to the summer and operable to amplify the integrated signal;
an analog-to-digital converter operable to convert the amplified integrated signal to a digital signal;
a demodulator operable to demodulate the digital signal; and
delay measurement means for determining a delay vector from inputs of the low pass filters to an output of the demodulator.

5. The radio receiver of claim 4, further comprising:
a DC offset calibrator coupled to the delay measurement means;
an in-phase digital-to-analog converter coupled between the DC offset calibrator and the second mixer stage; and
a quadrature phase digital-to-analog converter coupled between the DC offset calibrator and the second mixer stage,
wherein the in-phase digital-to-analog converter is operable to provide an in-phase DC offset compensation signal for the automatic gain control stage and the quadrature phase digital-to-analog converter is operable to provide a quadrature phase DC offset compensation signal for the automatic gain control stage.

6. A method of determining a signal delay between inputs of first and second low pass filters of a dual mixer stage radio receiver and an output of the receiver's demodulator, the method comprising the steps of:
applying a first known voltage to an input of an in-phase mixer of the second mixer stage;

applying a second known voltage to an input of a quadrature phase mixer of the second mixer stage;

setting the gain of an automatic gain control stage, coupled to the second mixer stage, to a full gain; measuring first in-phase and first quadrature phase components at the output of the demodulator;

decreasing the gain of the automatic gain control stage by a predetermined amount if the value of either first component is greater than a predetermined maximum threshold value;

storing the first in-phase and quadrature phase components if the value of each component is less than the predetermined maximum threshold value;

applying the negative of the first known voltage to the input of the in-phase mixer;

applying the second known voltage to the input of the quadrature phase mixer;

measuring second in-phase and second quadrature phase components at the output of the demodulator;

decreasing the gain of the automatic gain control stage by a predetermined amount if the value of either second component is greater than the predetermined maximum threshold value;

storing the second in-phase and quadrature phase components if the value of each second component is less than the predetermined maximum threshold value; and using the first and second quadrature phase components to compute the signal delay.

7. A method of compensating for DC offset voltages present at an input of a low noise amplifier of a dual mixer stage radio receiver, the method comprising the steps of:

determining a signal delay between an output of a second mixer stage of the dual mixer stage radio receiver, said signal delay characterizing in-phase and quadrature phase components of the DC offset voltage present at the input of the low noise amplifier;

using the determined signal delay to separate and define digital representations of the in-phase DC offset voltage component and the quadrature phase DC offset voltage component;

making the digital representation of each of the in-phase and quadrature phase components more positive or more negative if it is more negative or more positive than a predetermined minimum threshold or maximum threshold; and performing the above sequence of steps a predetermined number of times to reduce the DC offset voltage at the input of the low noise amplifier.

8. A method of setting signal levels of in-phase and quadrature phase components of a radio receiver between a minimum threshold voltage and a maximum threshold voltage, the method comprising the steps of:

(a) setting the gain of an automatic gain control to a gain value at which the signal levels of the in-phase and quadrature phase components are less than or equal to the maximum threshold voltage;

(b) comparing the signal levels of the in-phase and quadrature phase components to the minimum threshold voltage;

(c) increasing the gain of the automatic gain control stage by a predetermined amount; and (d) repeating steps (b) and (c) until the signal levels of the in-phase and quadrature phase components are greater than or equal to the minimum threshold voltage.

9. A method of compensating for DC offset voltages at inputs of in-phase and quadrature phase low pass filters of a dual mixer stage radio receiver, said method comprising the steps of:

determining a signal delay vector between the inputs of the low pass filters, said signal delay vector characterizing in-phase and quadrature phase components of DC offset voltages at the inputs of the low pass filters;

using the signal delay vector to separate and define in-phase and quadrature phase multiplication factors associated with the in-phase and quadrature phase DC offsets;

incrementally adjusting the signal level of the in-phase component to a more positive or more negative value if the in-phase multiplication factor has a negative or positive value, respectively; and incrementally adjusting the signal value of the quadrature phase component to a more positive or more negative value if the quadrature phase multiplication factor has a negative or positive value, respectively.

* * * * *